(12) United States Patent
Matsuura et al.

(10) Patent No.: US 8,828,780 B2
(45) Date of Patent: Sep. 9, 2014

(54) SUBSTRATE FOR PHOTOELECTRIC CONVERSION DEVICE AND METHOD OF MANUFACTURING THE SUBSTRATE, THIN-FILM PHOTOELECTRIC CONVERSION DEVICE AND METHOD OF MANUFACTURING THE THIN-FILM PHOTOELECTRIC CONVERSION DEVICE, AND SOLAR CELL MODULE

(75) Inventors: Tsutomu Matsuura, Tokyo (JP); Hiroya Yamarin, Tokyo (JP); Yuki Tsuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 2 days.

(21) Appl. No.: 13/639,312

(22) PCT Filed: Dec. 7, 2010

(86) PCT No.: PCT/JP2010/071915
§ 371 (c)(1),
(2), (4) Date: Oct. 4, 2012

(87) PCT Pub. No.: WO2011/125259
PCT Pub. Date: Oct. 13, 2011

(65) Prior Publication Data
US 2013/0025651 A1 Jan. 31, 2013

(30) Foreign Application Priority Data
Apr. 5, 2010 (JP) .................. 2010-087172

(51) Int. Cl.
*H01L 21/00* (2006.01)
*H01L 31/0236* (2006.01)
*H01L 31/18* (2006.01)
*H01L 31/0224* (2006.01)

(52) U.S. Cl.
CPC ...... *H01L 31/1888* (2013.01); *H01L 31/02366* (2013.01); *Y02E 10/50* (2013.01); *H01L 31/022483* (2013.01)

USPC ................... 438/71; 438/58; 438/56; 438/98; 257/E31.126

(58) Field of Classification Search
None
See application file for complete search history.

(56) References Cited

U.S. PATENT DOCUMENTS 8,153,885 B2 * 4/2012 Lim et al. .................. 136/244
2010/0133529 A1 * 6/2010 Taraschi et al. ............ 257/43
(Continued)

FOREIGN PATENT DOCUMENTS

JP 61 116886 6/1986
JP 62-69408 A 3/1987
(Continued)

OTHER PUBLICATIONS

International Search Report issued Mar. 15, 2011 PCT/JP10/71915 Filed Dec. 7, 2010.
(Continued)

*Primary Examiner* — Charles Garber
*Assistant Examiner* — Evren Seven
(74) *Attorney, Agent, or Firm* — Oblon, Spivak, McClelland, Maier & Neustadt, L.L.P.

(57) ABSTRACT

This invention relates to a method of manufacturing a substrate for photoelectric conversion device including, on a substrate, a first electrode layer formed of a transparent conductive material. The method includes a first transparent conductive film forming step of forming a first transparent conductive film on the substrate, a second transparent conductive film forming step of forming a second transparent conductive film under a film forming condition that an etching rate is low compared with the first transparent conductive film at a later etching step, and an etching step of wet-etching the second and first transparent conductive films to form recesses that pierce through at least the second transparent conductive film, with the bottoms of the recesses being present in the first transparent conductive film.

9 Claims, 6 Drawing Sheets

(56) References Cited

U.S. PATENT DOCUMENTS

| | | | |
|---|---|---|---|
| 2010/0193021 A1* | 8/2010 | Park et al. | 136/256 |
| 2011/0036399 A1* | 2/2011 | Lin et al. | 136/256 |
| 2011/0108118 A1* | 5/2011 | Yamarin et al. | 136/265 |
| 2011/0143483 A1* | 6/2011 | Jung et al. | 438/71 |
| 2011/0284061 A1* | 11/2011 | Vanecek et al. | 136/255 |
| 2012/0262385 A1* | 10/2012 | Kim et al. | 345/173 |

FOREIGN PATENT DOCUMENTS

| | | |
|---|---|---|
| JP | 2000-77692 A | 3/2000 |
| JP | 2000 252500 | 9/2000 |
| JP | 2000 294812 | 10/2000 |
| JP | 2002 111025 | 4/2002 |
| JP | 2003 115599 | 4/2003 |
| JP | 2005 2387 | 1/2005 |
| JP | 3801342 | 7/2006 |

OTHER PUBLICATIONS

Office Action issued in corresponding Chinese patent application No. 201080065856.7 dated Mar. 12, 2014.

* cited by examiner (a)

(b)

|  | COMPOSITION | FILM THICKNESS | SUBSTRATE TEMPERATURE |
|---|---|---|---|
| SECOND TRANSPARENT CONDUCTIVE FILM 22 | 0.5 wt% AZO | 300 nm | 460°C |
| FIRST TRANSPARENT CONDUCTIVE FILM 21 | 0.2 wt% AZO | 400 nm | 430°C |
| THIRD TRANSPARENT CONDUCTIVE FILM 23 | 0.5 wt% AZO | 400 nm | 460°C |

| | EXAMPLE 1 | EXAMPLE 2 | COMPARATIVE EXAMPLE 1 | COMPARATIVE EXAMPLE 2 |
|---|---|---|---|---|
| UNEVENNESS DIAMETER/ UNEVENNESS DEPTH | 10 | 20 | 1 | 2 |
| HAZE RATIO AT WAVELENGTH 800 nm (%) | 40 | 10 | 40 | 10 |
| SHORT-CIRCUIT CURRENT DENSITY (mA/cm$^2$) | 25.1 | 20.0 | 25.1 | 21.3 |
| OPEN-CIRCUIT VOLTAGE (V) | 0.510 | 0.521 | 0.509 | 0.518 |
| FILL FACTOR (%) | 68.2 | 71.0 | 63.8 | 69.1 |
| CONVERSION EFFICIENCY (%) | 8.76 | 7.39 | 8.18 | 7.63 |

…

SUBSTRATE FOR PHOTOELECTRIC CONVERSION DEVICE AND METHOD OF MANUFACTURING THE SUBSTRATE, THIN-FILM PHOTOELECTRIC CONVERSION DEVICE AND METHOD OF MANUFACTURING THE THIN-FILM PHOTOELECTRIC CONVERSION DEVICE, AND SOLAR CELL MODULE

FIELD

The present invention relates to a substrate for photoelectric conversion device and a method of manufacturing the substrate. The present invention further relates to a photoelectric conversion device in which the substrate for photoelectric conversion device is used, a method of manufacturing the photoelectric conversion device, and a solar cell module.

BACKGROUND

In recent years, the development of thin-film silicon photoelectric conversion devices including amorphous silicon and crystalline silicon is actively performed. In the development of the photoelectric conversion devices, there are two particularly important points. One is a reduction in costs and the other is improvement of performance. The thin-film silicon photoelectric conversion device is characterized in that the photoelectric conversion layer thereof is thin compared with a crystalline silicon photoelectric conversion device in which a bulk body of monocrystal or polycrystal is used as a photoelectric conversion layer. Specifically, whereas the photoelectric conversion layer of the crystalline silicon photoelectric conversion device has thickness of several hundred microns, the thin-film silicon photoelectric conversion device has thickness of several microns. As a result, the thin-film silicon photoelectric conversion device has an advantage that raw materials necessary for forming the device can be reduced compared with the crystalline silicon photoelectric conversion device. On the other hand, efficiency of use of incident light is low compared with the crystalline silicon photoelectric conversion device. Therefore, the efficiency of use is increased using a light trapping technology.

The light trapping technology is a technology for forming a fine unevenness structure in a light incident section or a light reflecting section and capturing light into the photoelectric conversion layer. When light is made incident on the unevenness structure, a course of the light is refracted on an interface. Therefore, optical path length in the photoelectric conversion layer increases. Further, because total reflection on the interface is repeated, efficiency of use of the light increases.

Therefore, in the past, various light trapping technologies for using a transparent conductive film having a surface texture structure as an electrode of a photoelectric conversion device are proposed. For example, a technology for forming a large surface texture structure after etching by increasing crystal orientation of the transparent conductive film from a layer distant from a substrate to a layer close to the substrate is proposed (see, for example, Patent Literature 1). Further, a technology for forming, immediately on a first transparent conductive film, an average height difference of unevenness of the surface of which is 100 nanometers to 1,000 nanometers, a second transparent conductive film having average film thickness of 50 nanometers to 500 nanometers and having an average height difference of unevenness of the surface smaller than that of the first transparent conductive film is proposed (see, for example, Patent Literature 2).

CITATION LIST

Patent Literature

Patent Literature 1: Japanese Patent No. 3801342
Patent Literature 2: Japanese Patent Application Laid-open No. 2000-252500

SUMMARY

Technical Problem

However, in the technology described in Patent Literature 1, the transparent conductive film has an intense surface texture structure, specifically, a surface texture structure having a large height difference of texture and a small unevenness diameter. As a result, there is a problem in that a crystal defect tends to occur in the photoelectric conversion layer formed on the transparent conductive film and characteristics of the thin-film photoelectric conversion device are deteriorated.

In the technology described in Patent Literature 2, to apply the surface texture structure to the first transparent conductive film, after forming the first transparent conductive film, the first transparent conductive film has to be removed from a film forming device once to apply etching thereto and has to be put in the film forming device again to form the second transparent conductive film. Therefore, there is a problem in that manufacturing costs for the substrate for photoelectric conversion device increase and mass productivity is insufficient.

The present invention has been devised in view of the above and it is an object of the present invention to obtain a substrate for photoelectric conversion device and a method of manufacturing the substrate, a thin-film photoelectric conversion device and a method of manufacturing the thin-film photoelectric conversion device, and a solar cell module that have a high light trapping effect and can suppress a crystal defect in a photoelectric conversion layer. It is also an object of the present invention to obtain a method of manufacturing a substrate for photoelectric conversion device that can provide the substrate with high mass productivity.

Solution to Problem

There is provided a method of manufacturing a substrate for photoelectric conversion device according to an aspect of the present invention, the photoelectric conversion device including, on a substrate, an electrode layer formed of a transparent conductive material, the method including: a first transparent conductive film forming step of forming a first transparent conductive film on the substrate; a second transparent conductive film forming step of forming a second transparent conductive film under a film forming condition that an etching rate is low compared with the first transparent conductive film at a later etching step; and an etching step of wet-etching the second and first transparent conductive films to form recesses that pierce through the second transparent conductive film, bottoms of the recesses being present in the first transparent conductive film.

Advantageous Effects of Invention

According to the present invention, the first transparent conductive film and the second transparent conductive film having the low etching rate compared with the first transparent conductive film are formed on the substrate. The first transparent conductive film and the second transparent conductive film are wet-etched to form the recesses having a diameter twice to twenty times as large as depth thereof in the first and second transparent conductive films. Therefore, the method has a high light trapping effect and has an effect of suppressing occurrence of a crystal defect in a photoelectric conversion layer formed on the substrate for photoelectric conversion device. The substrate for photoelectric conversion device in which the recess is formed by the wet etching after the first and second transparent conductive films are laminated is used. Therefore, the method also has an effect that it is possible to manufacture the substrate for photoelectric conversion device with high mass productivity compared with the past.

DESCRIPTION OF EMBODIMENTS

Substrates for photoelectric conversion device and methods of manufacturing the substrates, thin-film photoelectric conversion devices and methods of manufacturing the thin-film photoelectric conversion devices, and solar cell modules according to embodiments of the present invention are explained in detail below with reference to the accompanying drawings. The present invention is not limited by the embodiments. Sectional views of the thin-film photoelectric conversion devices used in the embodiments are schematic. Relations between thicknesses and widths of layers, ratios of the thicknesses of the layers, and the like are different from real ones.

First Embodiment

Figure 1:
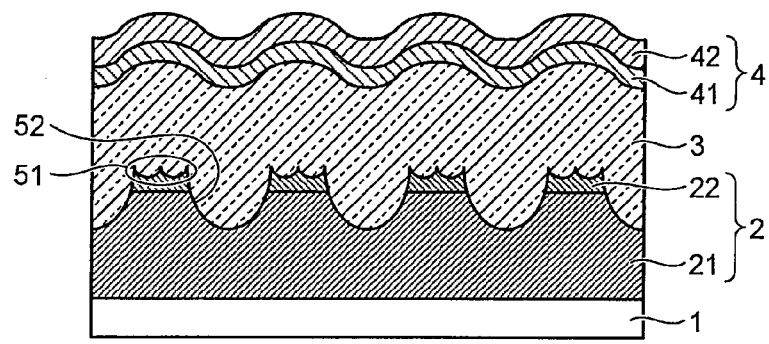
FIG. 1 is a schematic sectional view of an example of the configuration of a thin-film photoelectric conversion device according to a first embodiment.

FIG. 1 is a schematic sectional view of an example of the configuration of a thin-film photoelectric conversion device according to a first embodiment of the present invention. The thin-film photoelectric conversion device includes structure in which a first electrode layer 2, a photoelectric conversion layer 3, and a second electrode layer 4 are laminated in order on a substrate 1. It is assumed that light to be photoelectrically converted is made incident from the substrate 1 side.

Because the substrate 1 is located on a light incident side, the substrate 1 is formed of a material such as glass, an organic film, or ceramics having transparency. Because the first electrode layer 2 and the like are formed on the substrate 1, the substrate 1 is desirably a material having a melting point higher than a film forming temperature of the first electrode layer 2 and the like.

The first electrode layer 2 includes structure in which a first transparent conductive film 21 and a second transparent conductive film 22 are laminated on the substrate 1. An unevenness structure is formed near the upper surface of the first electrode layer 2. On the second transparent conductive film 22, small uneven portions 51 not piercing through the second transparent conductive film 22 are formed and recesses 52 piercing through the second transparent conductive film 22 and reaching the first transparent conductive film 21 are formed. The diameter of the recesses 52 is desirably 100 nanometers to 20 micrometers and is more desirably 1 micrometer to 20 micrometers to improve a light trapping effect for light in a near infrared light domain. The depth of the recesses 52 is desirably 100 nanometers to 1 micrometer. In this way, the diameter of the recesses 52 is more desirably twice to twenty times as large as the depth of the recesses 52. The light trapping effect is improved irrespective of which of the depth and the diameter of the recesses 52 is increased. However, when the depth is increased, it is likely that the unevenness structure becomes steep, crystal defects in the photoelectric conversion layer 3 formed on the first electrode layer 2 increase, and characteristics of the photoelectric conversion device are deteriorated. Therefore, in the first embodiment, the recesses 52 having the diameter equal to or larger than the depth are formed.

As such first and second transparent conductive films 21 and 22, a transparent conductive material such as ZnO can be used. For the purpose of reducing resistivity, AZO obtained by doping Al in ZnO, GZO doped with Ga, or the like can be used. The entire thickness of the first electrode layer 2 is desirably 100 nanometers to 10 micrometers. This is because, if the entire thickness is smaller than this range, the light trapping effect by the surface unevenness structure of the first electrode layer 2 is insufficient and, if the entire thickness is larger than this range, a film stress difference between the first electrode layer 2 and the substrate 1 increases and the first electrode layer 2 peels off or a fine crack is developed in the first electrode layer 2. Both the thicknesses of the first and second transparent conductive films 21 and 22 are desirably 50 nanometers to 5 micrometers.

The photoelectric conversion layer 3 is formed by a semiconductor film including a p-i-n junction structure. For example, a semiconductor film including a p-i-n junction structure in which p-type μc (crystalline)-Si:H, i-type μc-Si:H, and n-type μc-Si:H are laminated in order from the first electrode layer 2 side, a semiconductor film including a p-i-n junction structure of a two-layer tandem structure in which p-type a (amorphous)-SiC:H, i-type a-Si:H, n-type a-Si:H, p-type μc-Si:H, i-type μc-Si:H, and n-type μc-Si:H are laminated in order from the first electrode layer 2 side, or a semiconductor film including a p-i-n junction structure of a three-layer tandem structure in which p-type a-SiC:H, i-type a-Si:H, n-type a-Si:H, p-type a-SiGe:H, i-type a-SiGe:H, n-type a-SiGe:H, p-type μc-Si:H, i-type μc-Si:H, and n-type μc-Si:H are laminated in order from the first electrode layer 2 side can be used. When a plurality of stages of p-i-n junctions are laminated, to improve electrical and optical connection among the p-i-n junctions, μc-SiO$_x$ (x=0 to 2), ZnO, or ITO (Indium Tin Oxide) can be inserted among the respective p-i-n junctions.

The second electrode layer 4 includes structure in which a transparent conductive film 41 and a light reflective conductive film 42 formed right on the photoelectric conversion layer 3 are laminated. As the material of the transparent conductive film 41, a transparent conductive material such as ZnO, SnO$_2$, and ITO can be used. The photoelectric conversion layer 3 efficiently absorbs light in ultraviolet light and visible light domains. However, the absorptance of light in a near infrared light domain is low compared with the absorptance of the light in the ultraviolet light and visible light domains. Therefore, light made incident from the substrate 1 side and not absorbed by the photoelectric conversion layer 3 passes through the transparent conductive film 41, reflects on the light reflective conductive film 42, passes through the transparent conductive film 41, and enters the photoelectric conversion layer 3 again. In this way, as light transmittance in the visible light and near infrared light domains of the transparent conductive film 41 is higher, i.e., light absorptance is lower, an amount of light entering the photoelectric conversion layer 3 again increases. Therefore, characteristics of the photoelectric conversion device, in particular, a current value increases. Therefore, the transparent conductive film 41 is desirably a transparent conductive material having high light transmittance in the visible light and near infrared light domains.

The light reflective conductive film 42 has a role of extracting a photoelectrically converted electric current and has a role of reflecting light passed through the photoelectric conversion layer 3 without being absorbed. The light reflective conductive film 42 is desirably formed of a conductive material having high reflectance with respect to light in the visible light and near infrared light domains. As such a material, Ag, Ti, Al, Mo, and the like can be illustrated. However, Ag is particularly desirable because of an electric characteristic and a light reflection characteristic.

The first and second transparent conductive films 21 and 22 are explained more in detail. The recesses 52 are formed in the first and second transparent conductive films 21 and 22 by performing etching once as explained below. Therefore, to obtain the structure explained above, the materials of the first and second transparent conductive films 21 and 22 are selected such that the first transparent conductive film 21 has a high etching rate compared with the second transparent conductive film 22, specifically, such that a ratio of etching speed of the second transparent conductive film 22 to etching speed of the first transparent conductive film 21 is 0.9 to 0.1. When the etching speed ratio of the second transparent conductive film 22 to the first transparent conductive film 21 is larger than 0.9, because there is almost no difference in the etching rate from the first transparent conductive film 21, the diameter of the recesses 52 exceeding 1 micrometer cannot be obtained. Therefore, the etching speed ratio larger than 0.9 is undesirable. When the etching speed ratio of the second transparent conductive film 22 to the first transparent conductive film 21 is smaller than 0.1, the first transparent conductive film 21 is rapidly etched from starting points of unevenness due to the etching of the second transparent conductive film 22 and hollows tend to be formed in the first transparent conductive film 21. Therefore, the etching speed ratio smaller than 0.1 is undesirable.

The first and second transparent conductive films 21 and 22 having different etching rates can be obtained by, for example, changing film forming conditions such as a substrate temperature or changing an amount of dopant impurities doped in the transparent conductive material. It is known that a ZnO film, which is one kind of the transparent conductive material, has high C-axis orientation when formed under a condition of a high substrate temperature compared with formation under a condition of a low substrate temperature and this degree of the C-axis orientation leads to a difference in the etching rate. The degree of the C-axis orientation relates to the number (the density) of starting points from which a film is etched in a U shape during etching.

Figure 2:
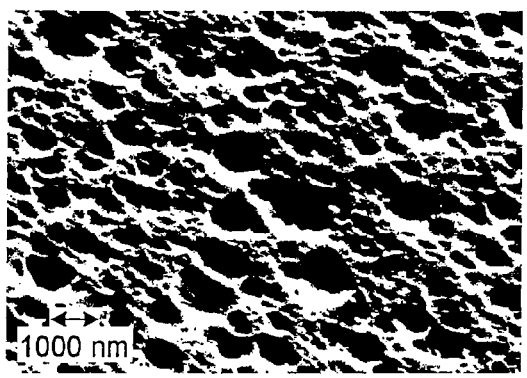
FIG. 2 shows scanning electron microscope photographs of surface states after ZnO films formed at different film forming temperatures are subjected to etching treatment.
Figure 2:
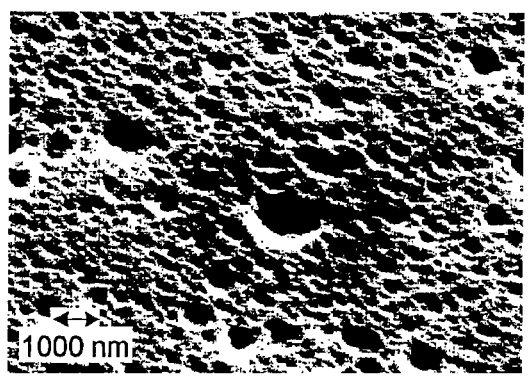
Figure 3:
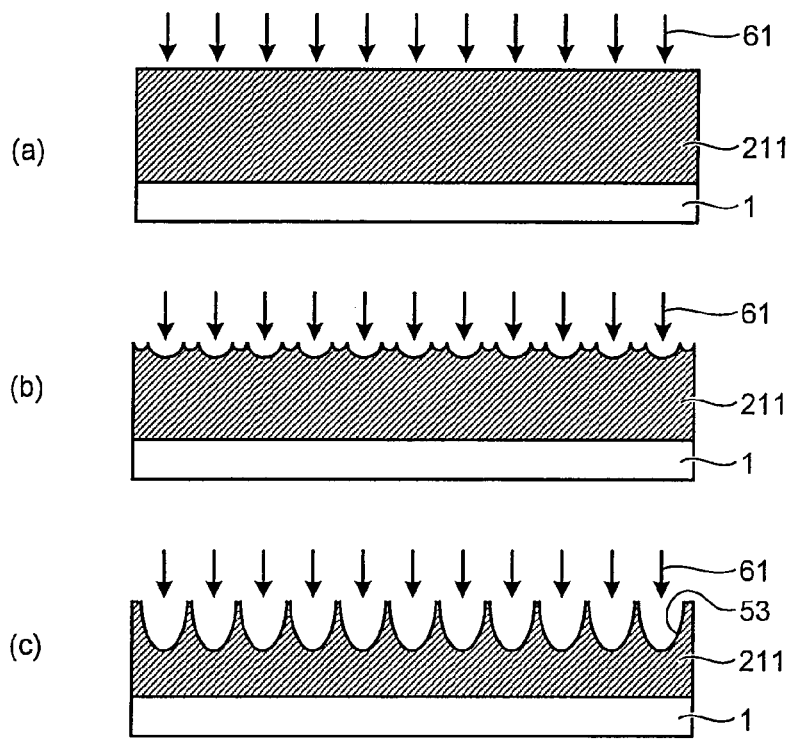
FIG. 3 shows a schematic sectional view of states of etching of a transparent conductive film having low C-axis orientation.
Figure 4:
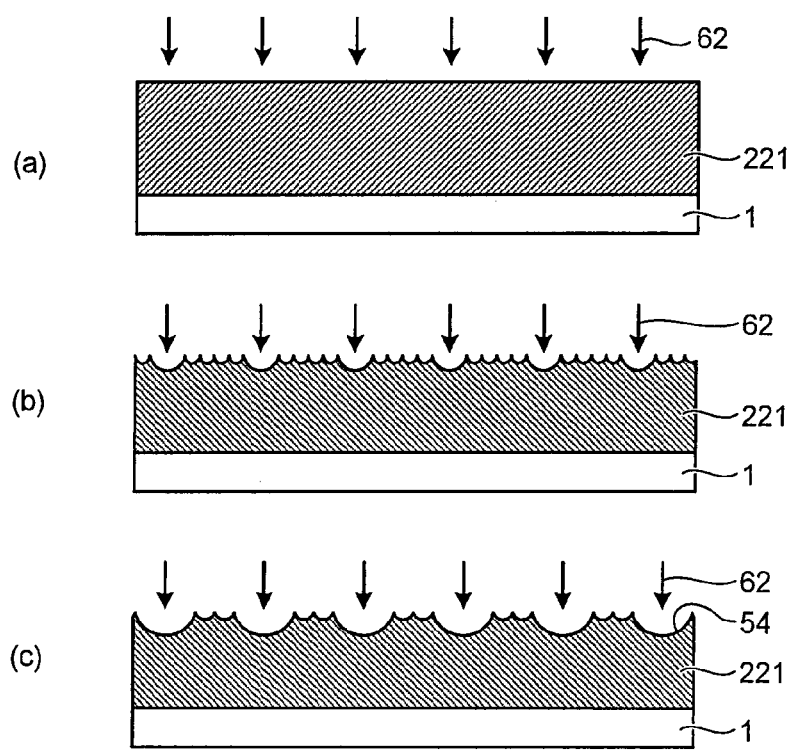
FIG. 4 shows a schematic sectional view of states of etching of a transparent conductive film having high C-axis orientation.

FIG. 2 shows scanning electron microscope (hereinafter referred to as SEM) photographs of surface states after ZnO films formed at different film forming temperatures are subjected to etching treatment. FIG. 3 shows schematic sectional views of states of etching of a transparent conductive film having low C-axis orientation. FIG. 4 shows a schematic sectional view of states of etching of a transparent conductive film having high C-axis orientation. After transparent conductive films 211 and 221 including ZnO are formed on the substrate 1 by 1 micrometer at different film forming temperatures by a sputtering method, the transparent conductive films 211 and 221 are wet-etched with a hydrochloric acid water solution for a predetermined time.

As shown in FIG. 3(a), when the transparent conductive film 211 is formed on the substrate 1 at a film forming temperature of 350° C., the transparent conductive film 211 is formed as a low C-axis orientation film as explained above. In this state, the transparent conductive film 211 is a flat film without unevenness on the surface. When such a transparent conductive film 211 is wet-etched, as shown in FIG. 3(b), in the low C-axis orientation film, a large number (high density) of starting points 61 from which the low C-axis orientation film is etched in a U shape during etching are formed. The etching is started from these starting points 61. Because an etching rate is large compared with a high C-axis orientation film explained below, when the etching is further performed, as shown in FIG. 3(c), the etching advances in the depth direction. As a result, recesses 53 having a large ratio of depth to a diameter are formed at high density in the transparent conductive film 211. This state is shown in FIG. 2(a).

On the other hand, as shown in FIG. 4(a), when the transparent conductive film 221 is formed on the substrate 1 at a film forming temperature of 410° C., the transparent conductive film 221 is formed as a high C-axis orientation film as explained above. In this state, as in FIG. 3(a), the transparent conductive film 221 is a flat film without unevenness on the surface. When such a transparent conductive film 221 is wet-etched, as shown in FIG. 4(b), in the high C-axis orientation film, the number (density) of starting points 62 from which the high C-axis orientation film is etched in a U shape during etching is small compared with the low C-axis orientation film shown in FIG. 3(b). The etching is started from these starting points 62. Because an etching rate is small in the high C-axis orientation film, even if the etching is further performed, as shown in FIG. 4(c), the etching in the depth direction does not advance much. As a result, recesses 54 having a small ratio of depth to a diameter are formed at low density in the transparent conductive film 221. This state is shown in FIG. 2(b).

In this way, by changing film forming conditions of the transparent conductive film, it is possible to control the number (density) of starting points from which the transparent conductive film is etched in a U shape and control an etching ratio. As the density of the starting points, $10^4$ to $10^6$ starting points are desirably present in 1 mm$^2$. This is because an average distance between starting points adjacent to each other is 1 micrometer to 10 micrometers and the diameter of recesses after etching can be set to 1 micrometer to 20 micrometers. Such a number (density) of starting points can be obtained by forming the transparent conductive film as a high C-axis orientation film. Incidentally, C-axis orientation referred to herein is specified as diffraction peak half width from a C surface in a result of measurement by an X ray diffraction method. In particular, C-axis orientation having half width smaller than 0.35 degree is referred to as high C-axis orientation and C-axis orientation having half width equal to or higher than 0.35 degree is referred to as low C-axis orientation.

As shown in FIGS. 2 to 4, the transparent conductive film 211 having the low C-axis orientation has large depth of the recesses compared with the transparent conductive film 221 having the high C-axis orientation. Therefore, it is expected that the light trapping effect is high. On the other hand, because the depth of the recesses 53 is large, crystal defects of the photoelectric conversion layer 3 formed on the first electrode layer 2 increase and the photoelectric conversion characteristic is deteriorated.

On the other hand, the transparent conductive film 221 having the high C-axis orientation has small depth of the recesses compared with the transparent conductive film 211 having the low C-axis orientation, the light trapping effect is low. However, because the depth of the recesses 54 is small compared with the transparent conductive film 211, an increase of crystal defects of the photoelectric conversion layer 3 formed on the first electrode layer 2 can be suppressed.

As explained above, when only the transparent conductive film 211 having the low C-axis orientation or only the transparent conductive film 221 having the high C-axis orientation is used as the first electrode layer 2, the light trapping effect and an effect of suppression of the number of crystal defects cannot be simultaneously attained. Therefore, in the first embodiment, the second transparent conductive film 22 having the high C-axis orientation is formed on the first transparent conductive film 21 having the low C-axis orientation, whereby the density of starting points during etching is set in a desired range and the recesses 52 having a diameter after etching of 100 nanometers to 20 micrometers and depth of 100 nanometers to 1 micrometer is formed in the first electrode layer 2.

An overview of operation in the thin-film photoelectric conversion device having such structure is explained. Incident light such as sunlight made incident from the rear surface (a surface on which the photoelectric conversion layer 3 and the like are not formed) of the substrate 1 is made incident on the photoelectric conversion layer 3 through the first electrode layer 2 and free carriers are generated in an i-type semiconductor layer in the photoelectric conversion layer 3. The generated free carriers are transported in the photoelectric conversion layer 3 by a built-in field formed by a p-type semiconductor layer and an n-type semiconductor layer in the photoelectric conversion layer 3 and an electric current is generated. The generated electric current is extracted from the first electrode layer 2 and the second electrode layer 4.

Incident light (e.g., light in the visible light and near infrared light domains) made incident on the photoelectric conversion layer 3 but not photoelectrically converted is transmitted through the transparent conductive film 41 of the second electrode layer 4 and reflected to the photoelectric conversion layer 3 side by the light reflective conductive film 42. At this point, a ratio of the light absorbed by the second electrode layer 4 is small because the transparent conductive film 41 is formed of a material having high transmittance of light in the visible light domain and the near infrared light domain and the light reflective conductive film 42 is formed of a material having high reflectance of light in the visible light domain and the near infrared light domain. A part of the light made incident on the photoelectric conversion layer 3 again is photoelectrically converted.

The light not photoelectrically converted by the photoelectric conversion layer 3 reaches the first electrode layer 2. In the first electrode layer 2, the recesses 52 having a diameter twice to twenty times as large as depth are formed. A part of the light reaching the first electrode layer 2 is reflected to the photoelectric conversion layer 3 again by the recesses 52. By repeating such a process, photoelectric conversion is performed by the thin-film photoelectric conversion device and an electric current (a voltage) is extracted to the outside.

Figure 5:
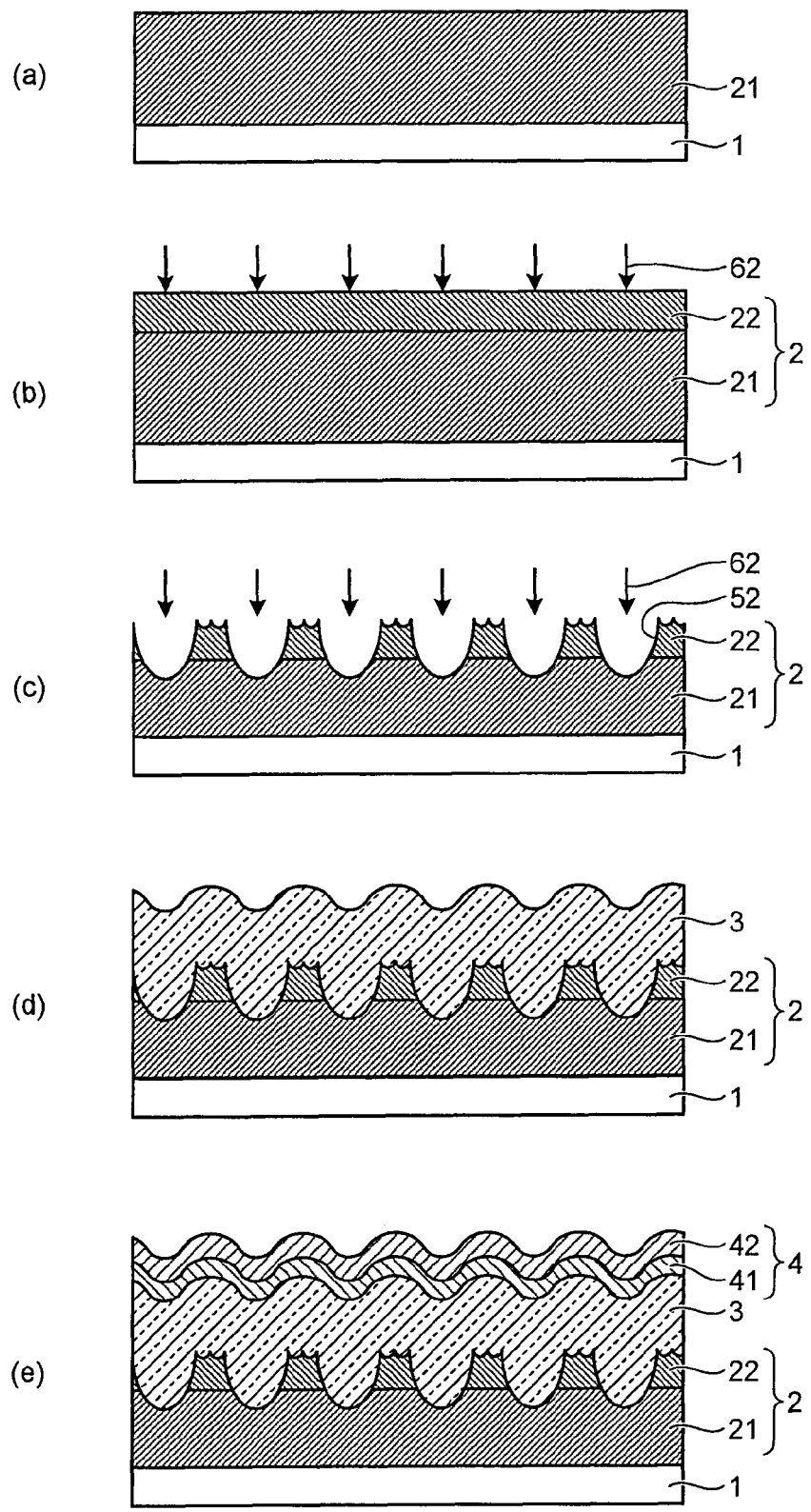
FIG. 5 shows a schematic sectional view for explaining an example of a method of manufacturing the thin-film photoelectric conversion device according to the first embodiment.

A method of manufacturing the thin-film photoelectric conversion device having the structure explained above is explained. FIG. 5 is a schematic sectional view for explaining an example of a method of manufacturing the thin-film photoelectric conversion device according to the first embodiment of the present invention. First, as shown in FIG. 5(a), the first transparent conductive film 21 is formed on the substrate 1 by a film forming method such as a vacuum evaporation method, a sputtering method, or a CVD (Chemical Vapor Deposition) method. The first transparent conductive film 21 is formed under a condition that an etching rate during wet-etching treatment is high compared with the second transparent conductive film 22 to be formed next. When, for example, ZnO is used as the first transparent conductive film 21, the first transparent conductive film 21 can be formed by the sputtering method at a film forming temperature (a substrate temperature) of 350° C. Consequently, the first transparent conductive film 21 is formed as a low C-axis orientation film. The thickness of the first transparent conductive film 21 can be set to 50 nanometers to 5 micrometers. The surface of the first transparent conductive film 21 in this state is flat without unevenness.

Subsequently, as shown in FIG. 5(b), the second transparent conductive film 22 is formed on the first transparent conductive film 21 by the film forming method such as the vacuum evaporation method, the sputtering method, or the CVD method. The second transparent conductive film 22 is formed under a film forming condition that an etching rate is low compared with the first transparent conductive film 21. When, for example, ZnO is used as the second transparent conductive film 22, the second transparent conductive film 22 can be formed by the sputtering method at the film forming temperature (the substrate temperature) of 410° C. Consequently, the second transparent conductive film 22 is formed as a film having C-axis orientation higher than that of the first transparent conductive film 21. The thickness of the second transparent conductive film 22 can be set to 50 nanometers to 5 micrometers. The second transparent conductive film 22 is a C-axis orientation film. The surface of the second transparent conductive film 22 in this state is flat without unevenness.

Thereafter, as shown in FIG. 5(c), the recesses 52 are formed in the first and second transparent conductive films 21 and 22 by wet etching. As a chemical for the wet etching, for example, an acid solution such as a hydrochloric acid water solution or an alkali solution such as a sodium hydroxide water solution can be used. In the wet etching, first, the starting points 62 from which the second transparent conductive film 22 is etched in a U shape are formed on the upper surface of the second transparent conductive film 22 to be present at a ratio of about $10^4$ to $10^6$ per 1 mm$^2$. The etching is started from the starting points 62. Because an etching rate of the second transparent conductive film 22 is low, the etching advances in a direction parallel to a substrate surface compared with the depth direction and shallow recesses are formed in the second transparent conductive film 22. This is the same as the state shown in FIG. 4(c). When time further elapses, the bottoms of the shallow recesses reach the first transparent conductive film 21. Then, the first transparent conductive film 21 is etched starting from portions where the bottoms of the shallow recesses reach the first transparent conductive film 21. At this point, the etching advances in the depth direction compared with the direction parallel to the substrate surface because the first transparent conductive film 21 has a large etching rate compared with the second transparent conductive film 22. In this way, first, through-holes reaching the first transparent conductive film 21 are formed to be sparsely scattered in the second transparent conductive film 22. Subsequently, the first transparent conductive film 21 at the bottom of the through-holes is etched via the through-holes. Most portions on the first transparent conductive film 21 are covered with the second transparent conductive film 22 and not etched. However, the recesses 52 having relatively large size are formed because a space between the through-holes adjacent to each other is large and etching speed is high in the first transparent conductive film 21 under the through-holes. The second transparent conductive film 22 and the first transparent conductive film 21 have the same main component. Therefore, the etching of the second transparent conductive film 22 and the first transparent conductive film 21 can be performed with the same etching liquid and is desirably continuously performed in the same process. The through-holes are sparsely scattered in the second transparent conductive film 22 because the second transparent conductive film 22 is a polycrystal film having high C-axis orientation and portions where etching is fast are locally scattered in grain boundaries of crystals. Consequently, a high light trapping effect is obtained and the recesses 52 having a ratio of a diameter and depth at which the number of crystal defects included in the photoelectric conversion layer 3 to be formed later decreases are formed. Further, the first electrode layer 2 is formed.

Subsequently, as shown in FIG. 5(d), the photoelectric conversion layer 3 including a semiconductor layer having a p-i-n structure is formed on the first electrode layer 2 by a film forming method such as the CVD method. As the photoelectric conversion layer 3, for example, a semiconductor film including a p-i-n junction structure in which p-type μc-Si:H, i-type μc-Si:H, and n-type μc-Si:H are laminated in order from the first electrode layer 2 side can be illustrated.

Thereafter, as shown in FIG. 5(e), the second electrode layer 4 including the transparent conductive film 41 and the light reflective conductive film 42 is formed by the film forming method such as the vacuum evaporation method, the sputtering method, or the CVD method. As the transparent conductive film 41, for example, a transparent conductive material such as ZnO can be illustrated. As the light reflective conductive film 42, for example, a metal material such as Ag can be illustrated. The photoelectric conversion layer 3 and the second electrode layer 4 include structure having unevenness to correspond the upper surface of the first electrode layer 2 in which the recesses 52 are formed. Consequently, the thin-film photoelectric conversion device shown in FIG. 1 is obtained.

In the above explanation, the etching rate is adjusted between the first transparent conductive film 21 and the second transparent conductive film 22 by changing the film forming temperature. However, for example, when the first electrode layer 2 is formed by the sputtering method, film properties (e.g., a crystal grain diameter and crystal orientation of a polycrystal transparent conductive film) of the first and second transparent conductive films 21 and 22 can be adjusted according to a gas type (rare gas and oxygen), a gas mixing ratio, a gas flow rate, film forming pressure, and the like besides the film forming temperature (the substrate temperature). In this way, the diameter and the depth of the recesses 52 in forming a surface texture structure with the wet-etching treatment are determined according to the crystal grain diameter and the crystal orientation of the first and second transparent conductive films 21 and 22.

In the above explanation, the etching rate is adjusted between the first transparent conductive film 21 and the second transparent conductive film 22 by changing the film forming conditions. However, anneal treatment can be performed before the etching treatment. By performing the anneal treatment, it is also possible to change the crystal grain diameter and the crystal orientation of the first and second transparent conductive films 21 and 22 and adjust the etching rate. The anneal treatment is performed after the etching treatment, whereby the film properties of the transparent conductive material forming the first electrode layer 2 such as an AZO film are improved. An effect that, for example, total light transmittance increases.

Further, in the above explanation, the first electrode layer 2, the photoelectric conversion layer 3, and the second electrode layer 4 are laminated in order on the substrate 1 to manufacture the thin-film photoelectric conversion device. However, the manufacturing of the thin-film photoelectric conversion device is not limited to this. For example, a process for performing processing up to formation processing for the first electrode layer 2 including the recesses 52 to manufacture the substrate for photoelectric conversion device can be performed as a separate process in advance to mass-produce the substrate for photoelectric conversion device. The photoelectric conversion layer 3 and the second electrode layer 4 can be formed on the substrate for photoelectric conversion device to form the thin-film photoelectric conversion device. Consequently, in a manufacturing process for the substrate for photoelectric conversion device, after the first and second transparent conductive films 21 and 22 are continuously formed on the substrate 1, the wet-etching treatment for forming the recesses 52 is performed. Therefore, it is possible to provide the substrate for photoelectric conversion device with high mass productivity compared with the method of forming the second transparent conductive film 22 after forming the first transparent conductive film 21 and performing the wet-etching treatment to form recesses.

In the first embodiment, the first electrode layer 2 on the light incident side is formed by laminating the first transparent conductive film 21 and the second transparent conductive film 22 having a low etching rate compared with the first transparent conductive film 21 and the density thereof at starting points during etching of about $10^4$ to $10^6$ per 1 mm$^2$. The recesses 52 having the diameter of 1 micrometer to 20 micrometers and the depth of 100 nanometers to 1 micrometer are formed in the first electrode layer 2 by the etching. Consequently, there is an effect that the trapping effect of light made incident on the thin-film photoelectric conversion device can be improved compared with the structure in the past, the density of crystal defects in the photoelectric conversion layer 3 formed on the first electrode layer 2 can be reduced, and the photoelectric conversion characteristic can be improved. It is also possible to improve a fill factor while keeping a short-circuit current value of the photoelectric conversion device.

Further, after the first transparent conductive film 21 and the second transparent conductive film 22 are continuously formed, the etching treatment is performed to manufacture the substrate for photoelectric conversion device. Therefore, compared with the manufacturing method in the past, it is possible to provide, with high mass-productivity, a substrate for thin-film photoelectric conversion device that has a high trapping effect for light made incident in the thin-film photoelectric conversion device and can reduce the density of crystal defects in the photoelectric conversion layer 3 formed on the first electrode layer 2.

Second Embodiment

Figure 6:
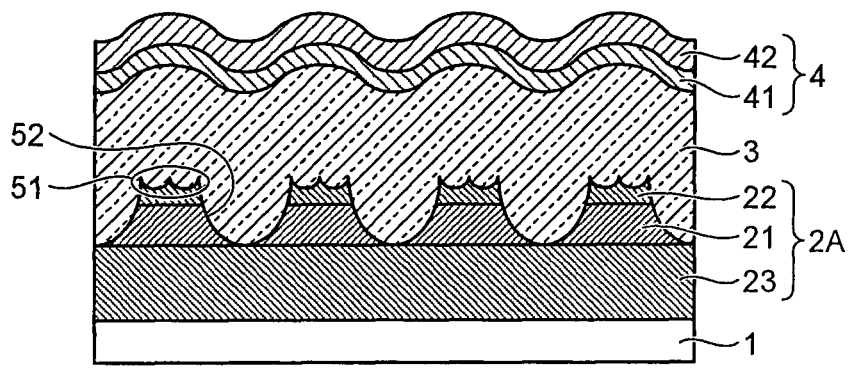
FIG. 6 is a schematic sectional view of an example of the structure of a thin-film photoelectric conversion device according to a second embodiment.

FIG. 6 is a schematic sectional view of an example of the structure of a thin-film photoelectric conversion device according to a second embodiment. In the thin-film photoelectric conversion device according to the second embodiment, a first electrode layer 2A includes first to third transparent conductive films 21 to 23. In other words, the thin-film photoelectric conversion device includes structure in which the third transparent conductive film 23 is inserted between the substrate 1 and the first transparent conductive film 21 in the first embodiment. The third transparent conductive film 23 has a function of a stopper for the recesses 52 formed by etching the second and first transparent conductive films 22 and 21. The third transparent conductive film 23 is formed of a material having a low etching rate compared with the first transparent conductive film 21. Consequently, the recesses 52 are provided to pierce through the second and first transparent conductive films 22 and 21. The bottoms of the recesses 52 are present in the third transparent conductive film 23. As such a third transparent conductive film 23, ZnO, AZO, GZO, or the like can be used. More specifically, ZnO, AZO, GZO, or the like having high C-axis orientation compared with the first transparent conductive film 21 can be used.

For example, if etching is insufficient and depth is small concerning the surface shape of the first electrode layer 2 in the first embodiment, a light trapping effect is insufficient and characteristics of the thin-film photoelectric conversion device are deteriorated. Therefore, it is desirable to adjust the etching to pierce through the second transparent conductive film 22 and reach the first transparent conductive film 21. At this point, if the etching reaches the substrate 1, the photoelectric conversion layer 3 is formed right on the substrate 1 in a portion where the etching reaches the substrate 1. Photoelectric conversion cannot be performed in this portion and the characteristics of the entire thin-film photoelectric conversion device are deteriorated. To prevent this problem, in the second embodiment, as shown in FIG. 2, the third transparent conductive film 23 having the function of the etching stopper is inserted between the substrate 1 and the first transparent conductive film 21. Components same as those in the first embodiment are denoted by the same reference numerals and signs and explanation of the components is omitted.

The thin-film photoelectric conversion device shown in FIG. 6 is manufactured by, after forming the third transparent conductive film 23 on the substrate 1 by the film forming method such as the vacuum evaporation method, the sputtering method, or the CVD method under a film forming condition that an etching rate is lower than that of the first transparent conductive film 21 to be formed later, forming the first transparent conductive film 21 and performing a procedure same as that shown in FIG. 5(b) and subsequent figures. During etching for forming the recesses 52, after the etching advances to the bottom of the first transparent conductive film 21, the third transparent conductive film 23 is not excessively etched in the depth direction because an etching rate of the third transparent conductive film 23 is low compared with the etching rate of the first transparent conductive film 21. The bottoms of the recesses 52 are formed in a shape close to flat.

In the second embodiment, the third transparent conductive film 23 is inserted between the substrate 1 and the first transparent conductive film 21 such that the etching is stopped in the third transparent conductive film 23 during the formation of the recesses 52 in the second and first transparent conductive films 22 and 21. Consequently, there is an effect that it is possible to prevent a situation in which the first electrode layer 2A is etched until the substrate 1 is exposed during the formation of the recesses 52 and prevent deterioration of the characteristics of the entire thin-film photoelectric conversion device. Because the bottom of recesses of an uneven shape is flat compared with the first embodiment, there is also an effect that it is possible to prevent crystal defects of the photoelectric conversion layer 3 formed on the first electrode layer 2A and a fill factor of the photoelectric conversion device increases.

In the above explanation, the solar battery cell is explained. However, a solar cell module in which a plurality of solar battery cells are connected in series on the substrate 1 can also be formed. In this case, for example, the solar cell module can be obtained by repeating a configuration in which the second electrode layer 4 of a certain solar battery cell and first electrode layers 2 and 2A of an adjacent solar battery cell are connected.

An example 1 and an example 2 of the thin-film photoelectric conversion device according to the embodiments of the present invention are explained together with a comparative example 1 and a comparative example 2.

Structure

As a thin-film photoelectric conversion device according to the example 1 and the example 2, the thin-film photoelectric conversion device shown in FIG. 6 in the second embodiment is used. An alkali-free glass substrate is used as the substrate 1, AZO is used as the first to third transparent conductive films 21 to 23, and the entire thickness of the first electrode layer 2A is set to 1 micrometer. As the photoelectric conversion layer 3, a semiconductor layer including a p-i-n junction in which p-type µc-Si:H, i-type µc-Si:H, and n-type µc-Si:H are laminated in order from the first electrode layer 2A side is used. The thickness of the i-type µc-Si:H is set to 3 micrometers. Further, AZO having thickness of 90 nanometers is used as the transparent conductive film 41 forming the second electrode layer 4. Ag having thickness of 300 nanometers is used as the light reflective conductive film 42.

Figure 7:
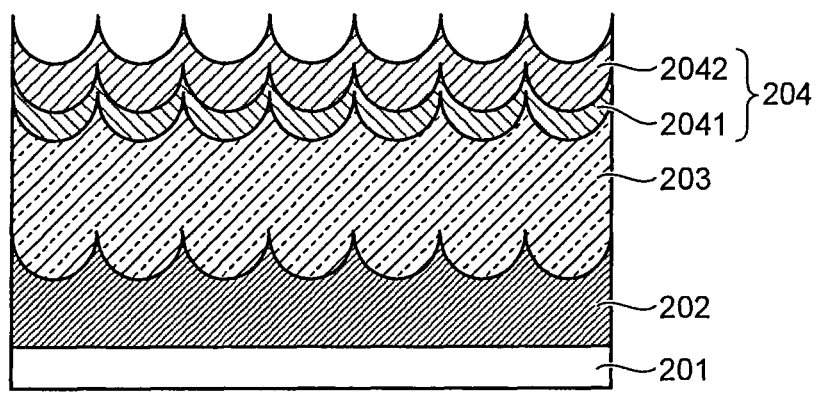
FIG. 7 is a schematic sectional view of the structure of a thin-film photoelectric conversion device according to a comparative example 1 and a comparative example 2.

As a thin-film photoelectric conversion device according to the comparative example 1 and the comparative example 2, a thin-film photoelectric conversion device having structure in the past in which a ratio of a diameter to depth is equal to or lower than two is used. FIG. 7 is a schematic sectional view of the structure of the thin-film photoelectric conversion device according to the comparative example 1 and the comparative example 2. The thin-film photoelectric conversion device according to the comparative example 1 and the comparative example 2 includes structure in which a first electrode layer 202, a photoelectric conversion layer 203, and a second electrode layer 204, in which a transparent conductive film 2041 and a light reflective conductive film 2042 are laminated, are formed on a substrate 201 in order. As the first electrode layer 202 in the comparative example 1, an AZO film same as that of the first transparent conductive film 21 in the example 1 is used. As the first electrode layer 202 in the comparative example 2, an AZO film same as that of the second transparent conductive film 22 in the example 1 is used. The substrate 201, the photoelectric conversion layer 203, and the second electrode layer 204 are the same as the substrate, the photoelectric conversion layer, and the second electrode layer in the example 1 and the example 2.

Manufacturing Method

Figures 8, 9:
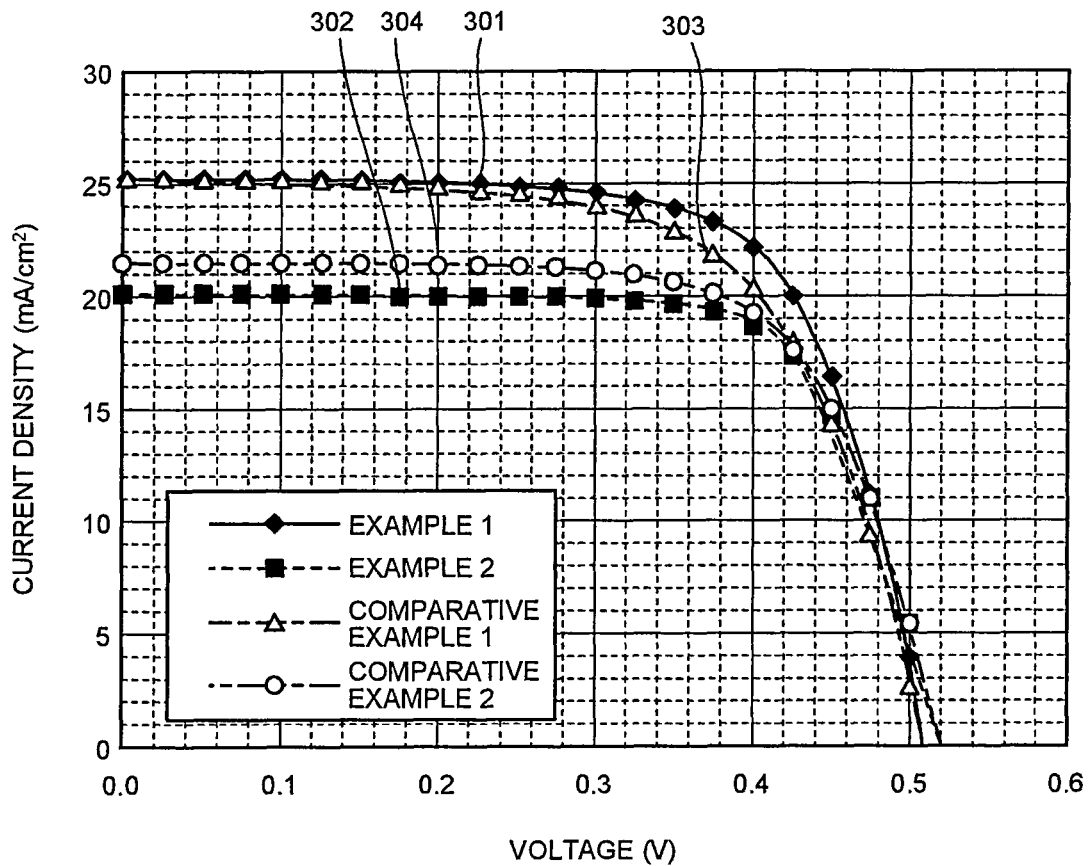
FIG. 8 is a table of film forming conditions for a first electrode layer of a thin-film photoelectric conversion device according to an example 1 and an example 2.
FIG. 9 is a graph of current-voltage characteristics of the thin-film photoelectric conversion devices according to the example 1, the example 2, the comparative example 1, and the comparative example 2.

The thin-film photoelectric conversion device according to the example 1 and the example 2 is manufactured as explained in the embodiments. A method of forming the first electrode layer 2A and a method of forming the recesses 52 are as explained below. FIG. 8 is a table of film forming conditions for the first electrode layer of the thin-film photoelectric conversion device according to the examples. As shown in the figure, on the substrate 1, 0.5 wt % of an AZO film is formed at thickness of 400 nanometers as the third transparent conductive film 23 under a substrate temperature of 460° C., 0.2 wt % of an AZO film is formed at thickness of 400 nanometers as the first transparent conductive film 21 under a substrate temperature of 430° C., and 0.5 wt % of an AZO film is formed as the second transparent conductive film 22 under a substrate temperature of 460° C. The film forming temperature (the substrate temperature) and a composition of a dope material are varied in this way. Consequently, it is possible to control the density of starting points during later wet etching and vary an etching rate.

Subsequently, wet etching is performed with 0.21 wt % of a hydrochloric acid water solution to form the recesses 52 that pierce through the second and first transparent conductive films 22 and 21. An etching rate of the second and third transparent conductive films 22 and 23 is 5 nm/s. An etching rate of the first transparent conductive film 21 is 10 nm/s. In the example 1, the wet etching is performed for 90 seconds. The average thickness of the first electrode layer 2A after the etching is 400 nanometers. In the example 2, the wet etching is performed for 70 seconds. The average thickness of the first electrode layer 2A after the etching is 600 nanometers. Thereafter, after water washing and drying are performed, as explained in the first embodiment, the photoelectric conversion layer 3 and the second electrode layer 4 are formed.

On the other hand, in the thin-film photoelectric conversion device according to the comparative example 1, 0.2 wt % of an AZO film is formed on the substrate 201 at thickness of 1 micrometer as the first electrode layer 202 under a substrate temperature of 430° C. Film forming conditions for the first electrode layer 202 are the same as the film forming conditions for the first transparent conductive film 21 in the example 1. In the thin-film photoelectric conversion device according to the comparative example 2, 0.5 wt % of an AZO film is formed on the substrate 201 at thickness of 1 micrometer as the first electrode layer 202 under a substrate temperature of 460° C. Film forming conditions for the first electrode layer 202 are the same as the film forming conditions for the second transparent conductive film 22 in the example 1. In the comparative example 1 and the comparative example 2, wet etching is applied with 0.21 wt % of a hydrochloric acid water solution. In the wet-etching treatment, the recesses 53 are formed in the state shown in FIG. 3. Thereafter, after water washing and drying are performed, as in the examples, the photoelectric conversion layer 203 and the second electrode layer 204 are formed.

Evaluation Method

Concerning a manufactured thin-film solar cell, pseudo sunlight is irradiated from the substrates 1 and 201 sides by a solar simulator, a current-voltage characteristic is measured, and short-circuit current density, an open-circuit voltage, a fill factor, and conversion efficiency are calculated. A haze ratio at wavelength of 800 nanometers is also calculated.

Evaluation Result

Figures 10, 11:
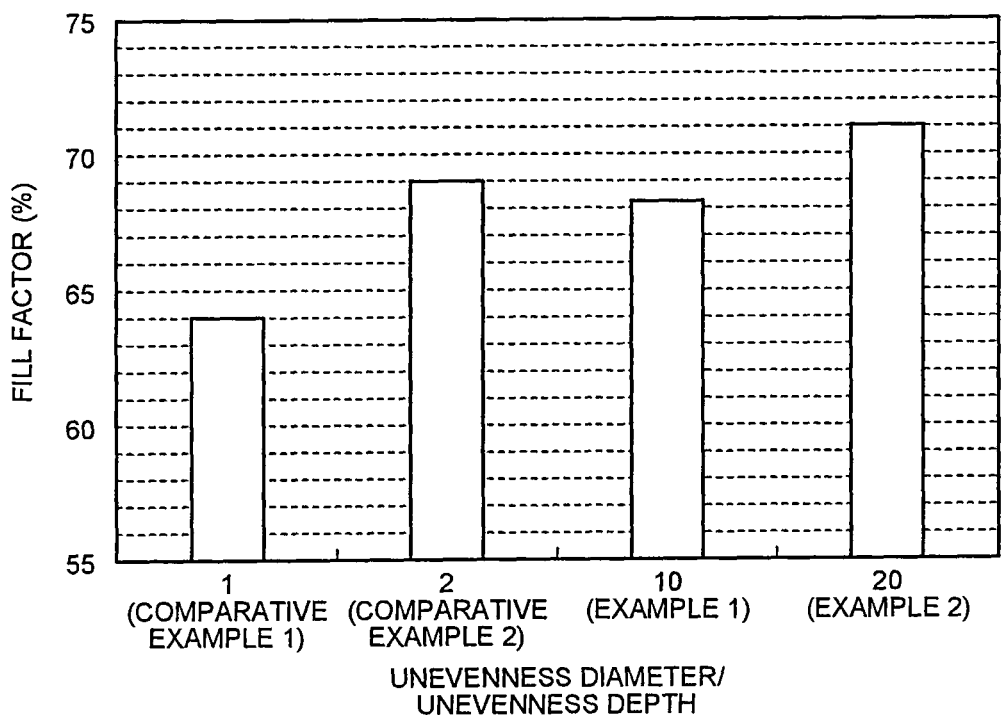
FIG. 10 is a table of characteristics of the thin-film photoelectric conversion devices according to the example 1, the example 2, the comparative example 1, and the comparative example 2.
FIG. 11 is a graph of an example of changes in a fill factor due to differences in a diameter with respect to the depth of recesses.

FIG. 9 is a graph of current-voltage characteristics of the thin-film photoelectric conversion devices according to the example 1, the example 2, the comparative example 1, and the comparative example 2. FIG. 10 is a table of characteristics of the thin-film photoelectric conversion devices according to the example 1, the example 2, the comparative example 1, and the comparative example 2. FIG. 11 is a graph of comparison of fill factors of the thin-film photoelectric conversion devices according to the diameter and the depth of the recesses in the first electrode layer. In FIG. 9, the abscissa indicates a voltage (V) and the ordinate indicates current density (mA/cm$^2$) of the thin-film photoelectric conversion devices. Curved lines 301, 302, 303, and 304 in FIG. 9 respectively indicate voltage-current characteristics of the thin-film photoelectric conversion devices according to the example 1, the example 2, the comparative example 1, and the comparative example 2. Unevenness diameter/unevenness depth in FIG. 10 indicates a ratio of an unevenness diameter to unevenness depth of the recesses 52 to 54 in the substrates for photoelectric conversion device after the first electrode layers 2A and 202 are formed on the substrates 1 and 201 and wet etching is performed. A haze ratio at wavelength of 800 nanometers in FIG. 10 is an index indicating, concerning the substrates for photoelectric conversion device, a light scattering degree of light at the time when light having wavelength of 800 nanometers is irradiated from the substrates 1 and 201 side.

As shown in FIGS. 9 and 10, in the thin-film photoelectric conversion device according to the example 2, all of short-circuit current density (current density at a voltage of 0 volt), an open-circuit voltage (a voltage at an electric current of 0 milliampere), and a fill factor are values of the same levels as those in the example 2. However, in the thin-film photoelectric conversion device according to the example 1, the fill factor is improved by 4.4 points compared with the comparative example 1. As a result, conversion efficiency is improved by about 0.6 point compared with the comparative example 1.

In the example 2 and the comparative example 2, the unevenness diameter/unevenness depth is different but the haze ratio is the same. In the example 1 and the comparative example 1, the unevenness diameter/unevenness depth is different but the haze ratio is the same. In the example 1 and the comparative example 1 in which the haze ratio is high, film defects in the photoelectric conversion layers 3 and 203 due to unevenness formation tend to occur compared with the example 2 and the comparative example 2. Therefore, in the example 2 and the comparative example 2 in which the haze ratio and the short-circuit current density are values of the same levels, there is no large difference in the characteristics of the photoelectric conversion devices. However, in the example 1 and the comparative example 1, the fill factor of the example 1 is improved by about 4.4 points compared with the comparative example 1. This indicates that the substrate for photoelectric conversion device in the example 1 has a high light trapping effect and an effect of suppressing occurrence of crystal defects in the photoelectric conversion layer formed on the substrate for photoelectric conversion device.

As shown in FIG. 11, in the example 1, the example 2, the comparative example 1, and the comparative example 2, the fill factor is apparently low only in the comparative example 1 compared with the other examples. Therefore, a lower limit of the unevenness diameter/unevenness depth is desirably equal to or larger than two. Further, the unevenness diameter/unevenness depth in the example 2 is 20 and the haze ratio at this unevenness diameter/unevenness depth is 10%. If the haze ratio falls below 10%, the light trapping effect is hardly obtained and the short-circuit current density and the conversion efficiency fall. Consequently, an upper limit of the unevenness diameter/unevenness depth is desirably equal to or smaller than 20.

As explained above, with the thin-film photoelectric conversion device according to the example 1, the recesses 52 are formed in the first electrode layer 2A such that the diameter thereof is 100 nanometers to 20 micrometers and the depth thereof is 100 nanometers to 1 micrometer. Therefore, there is an effect that it is possible to improve the conversion efficiency compared with the comparative example 1.

INDUSTRIAL APPLICABILITY

As explained above, the substrate for photoelectric conversion device according to the present invention is useful for manufacturing of the thin-film photoelectric conversion device.

REFERENCE SIGNS LIST 1, 201 substrates
2, 2A, 202 first electrode layers
3, 203 photoelectric conversion layers
4, 204 second electrode layers
21 first transparent conductive film
22 second transparent conductive film
23 third transparent conductive film
41, 211, 221, 2041 transparent conductive films
42, 2042 light reflective conductive films
51 uneven portions
52 to 54 recesses
61, 62 starting points

The invention claimed is:

1. A method of manufacturing a substrate for a photoelectric conversion device, the method comprising:
  forming a first transparent conductive film on a substrate;
  forming a second transparent conductive film such that an etching rate is low compared with the first transparent conductive film at a later etching step;
  wet-etching the second and first transparent conductive films to form recesses that pierce through the second transparent conductive film, such that bottoms of the recesses are present in the first transparent conductive film; and
  at the forming of the first transparent conductive film, after forming a third transparent conductive film on the substrate such that an etching rate is low compared with the first transparent conductive film at the later etching step, the first transparent conductive film is formed on the third transparent conductive film; and
  at the wet etching, the recesses piercing through the second and first transparent conductive films are formed such that the third transparent conductive film is a stopper.

2. The method of claim 1, wherein, at the wet-etching, formation of through-holes reaching the first transparent conductive film to be scattered in the second transparent conductive film and etching of the first transparent conductive film via the through-hole are continuously performed with same etching liquid.

3. The method of claim 1, wherein:
  the first and second transparent conductive films are ZnO films;
  at the forming of the first and second transparent conductive films, the ZnO films are formed such that film forming temperatures of the ZnO films and amounts of dopant impurities doped in the ZnO films are different; and
  at the wet-etching, the ZnO films are etched with an acid or alkali solution.

4. The method of claim 1, wherein, at the forming of the second transparent conductive film, the second transparent conductive film is formed such that a ratio of etching speed of the second transparent conductive film to etching speed of the first transparent conductive film is 0.9 to 0.1.

5. The method of claim 1, wherein, at the forming of the second transparent conductive film, the second transparent conductive film is formed such that starting points of the recesses formed at etching are formed at a ratio of $10^4$ to $10^6$ starting points in 1 $mm^2$.

6. The method of claim 1, further comprising, after the forming of the second transparent conductive film, treating the first and second transparent conductive films with an anneal treatment.

7. The method of claim 1, further comprising, after the wet-etching, treating the first and second transparent conductive films with an anneal treatment.

8. The method of claim 1, wherein:
  the third transparent conductive film is a ZnO film; and
  at the forming of the first transparent conductive film, the ZnO film forming the third transparent conductive film is formed such that a film forming temperature of the ZnO film and an amount of dopant impurities doped in the ZnO film are different from a film forming temperature of the ZnO film forming the first transparent conductive film and an amount of dopant impurities doped in the ZnO film.

9. A method of manufacturing a thin-film photoelectric conversion device, the method comprising:
  forming a photoelectric conversion layer, on a substrate manufactured by the method according to claim 1, such that the photoelectric conversion layer comprises a semiconductor layer comprising a p-i-n structure; and
  forming an electrode layer on the photoelectric conversion layer, and forming another electrode layer that forms a pair with the electrode layer.

* * * * *